United States Patent
Cho

[19]

[11] Patent Number: 5,969,941
[45] Date of Patent: Oct. 19, 1999

[54] DEVICE FOR MOUNTING FAN IN A PORTABLE COMPUTER

[75] Inventor: Duk-Soon Cho, Kyunggi-do, Rep. of Korea

[73] Assignee: SamSung Electronics Co., Ltd., Kyungki-do, Rep. of Korea

[21] Appl. No.: 09/022,032

[22] Filed: Feb. 11, 1998

[30] Foreign Application Priority Data

Feb. 12, 1997 [KR] Rep. of Korea .......................... 97-4056

[51] Int. Cl.⁶ ............................................... H05K 7/20
[52] U.S. Cl. .......................... 361/687; 361/683; 361/685; 361/697; 415/176; 415/178; 454/184; 312/298; 174/35 GC; 165/80.2
[58] Field of Search ..................... 361/683, 687, 361/690–698, 702–719, 796, 816, 685; 415/176, 178; 454/184; 62/3.2, 3.7; 360/97.01; 312/138.1, 298; 174/35 GC; 165/80.2, 80.3, 165; 70/58

[56] References Cited

U.S. PATENT DOCUMENTS

| | | |
|---|---|---|
| 4,739,445 | 4/1988 | Tragen . |
| 4,751,872 | 6/1988 | Lawson, Jr. . |
| 4,834,615 | 5/1989 | Manch et al. ........................ 415/213.1 |
| 5,062,016 | 10/1991 | Zupanic . |
| 5,079,438 | 1/1992 | Heung . |
| 5,101,321 | 3/1992 | Remise et al. . |
| 5,136,465 | 8/1992 | Benck et al. . |
| 5,142,442 | 8/1992 | Daniels et al. . |
| 5,186,605 | 2/1993 | Tracy . |
| 5,338,214 | 8/1994 | Steffes et al. ........................... 439/160 |
| 5,673,029 | 9/1997 | Behl et al. . |
| 5,731,952 | 3/1998 | Ohgami et al. ........................ 361/687 |

*Primary Examiner*—Leo P. Picard
*Assistant Examiner*—Michael Datskovsky
*Attorney, Agent, or Firm*—Robert E. Bushnell, Esq.

[57] ABSTRACT

A device for mounting a ventilating fan in a portable computer that uses a combination boss and bracket to simplify the assembly process. The fan mounting device of the present invention allows the space occupied by the fan within a portable computer to be minimized and the number of parts necessary for mounting the fan to be reduced. This results in a timesavings during the fan assembly process and improves the total efficiency of the computer assembly process.

22 Claims, 10 Drawing Sheets

5,969,941

DEVICE FOR MOUNTING FAN IN A PORTABLE COMPUTER

CLAIM OF PRIORITY

This application makes reference to, incorporates the same herein, and claims all rights accruing thereto under 35 U.S.C. §119 through my patent application entitled Device for Mounting Fan in a Portable Computer earlier filed in the Korean Industrial Property Office on the 12th day of February 1997 and there duly assigned Ser. No. 1997/4056.

BACKGROUND OF THE INVENTION

1. Field of the Invention

The present invention relates to portable computer systems, and more particularly to installation of a ventilating fan in limited space of a portable computer. The invention is further directed to a mounting device which provides for an easy assembly and dismantlement of the components of the portable computer.

2. Background Art

Rapid technological developments in semiconductor devices have resulted in the reduction in size of large-capacity computers. This has led to the development of personal computers that in some cases are small enough to be easily portable. Typical examples of portable computers are the laptop computer, the notebook computer, and the palmtop computer. As these portable computers grow in speed and shrink in size, the power consumed within the computer per unit volume increases dramatically. This makes the dissipation of heat critical during the operation of the portable computer to ensure that the components remain within their normal operating temperature ranges.

Conventionally, computers have used fans to replace heated air within the computer with cooler air from outside the computer system. Critical components, such as the central processing unit are often cooled by having a fan directly propel air across the surface of the component. Computer systems may incorporate either a general fan, a fan oriented to blow air across a specific component, or a combination of both. With portable computers it is common to use a heat sink with the central processing unit to increase the heat-dissipating surface area of the central processing unit for more effective cooling. These heat sinks often have a plurality of heat-dissipating projections or elements on an upper surface that are used to increase the heat transfer surface area. A lower surface of the heat sink is placed onto the component and a retention clip is employed to wrap around the heat sink and to grip a lower surface of the component with inward-facing projections.

In addition to using heat sinks to cool the central processing system, a ventilating fan is often used in a portable computer to provide an efficient means to further dissipate the heat generated by the central processing unit. A fan is generally placed along a sidewall of the portable computer housing to act as an air exchanger for the computer system. Furthermore, a fan is often positioned to propel air flow over the central processing unit. Computers often use a biscuit-type fan driven by a motor to achieve the necessary cooling. The biscuit-type fan is designed as small as possible to allow the fan to fit within the dimensional limitations of the portable computer housing. Techniques for simplifying the mounting of fans that cool the central processing units in computers are shown, for example, in U.S. Pat. No. 5,186,605 to Tracy entitled Computer Cooling Fan Vibration Isolation Apparatus, U.S. Pat. No. 5,062,016 to Zupancic entitled Set of Structural Brackets that Allow Electronic/Electrical Assemblies to be Mounted Within a Computer Enclosure, U.S. Pat. No. 5,673,029 to Behl entitled Apparatus for cooling a Memory Storage Device, U.S. Pat. No. 5,101,321 to Remise entitled Module for Muffling a Fan and for Fixation to an Electronic Machine Chassis, U.S. Pat. No. 4,739,445 to Tragen entitled Electronic Computer Cabinetry Having Fan and Power Supply Drawers and Connector Port Arrangement, U.S. Pat. No. 4,751,872 to Lawson entitled Ventilation System, U.S. Pat. No. 5,079,438 to Heung entitled Circuit Module Fan Assembly, U.S. Pat. No. 5,142,442 to Daniels entitled Combined Fan Spacer and Wire Guide, U.S. Pat. No. 5,136,465 to Benck entitled Personal Computer with Tandem Air Flow Dual Fans and Baffle Directed Air Cooling.

The installation of fans inside computers remains difficult, despite the improvements made by the prior art, largely due to difficulties caused by the small size of the fan and the limited space available in which to place it. Furthermore, additional parts, such as a bracket and a multiplicity of screws, are necessary to mount the fan in the portable computer. The fan is often first attached to the bracket by using screws and then the fan assembly is mounted inside the portable computer. Thus, the fan assembly work is time-consuming and lowers the total assembly work efficiency. I believe it is possible to improve on the contemporary devices used for installing fans in computers by using a device that requires few individual parts and fasteners, that can be simply adjusted for fans slightly out of tolerance, and that reduces the amount of area occupied by the fan within the computer. By reducing the number of parts required to install the fan, the amount of time needed for assembly goes down, the cost of installation goes down, and the probabilities of a tolerance error occurring are reduced. The reduction in the number of fasteners used will further speed up the installation process.

SUMMARY OF THE INVENTION

Accordingly, it is an object of the present invention to provide an improved device for mounting a fan inside a portable computer.

It is another object to provide a device for mounting a fan inside a portable computer that can minimize the amount of area occupied by the fan.

It is still another object to provide a device for mounting a fan inside a computer that reduces the number of parts necessary to complete the mounting process.

It is yet another object to provide a device for mounting a fan inside a computer that is easily adjusted to compensate for a fan that has a dimension outside of the normal tolerance range.

These and other objects can be achieved by using a mounting device that may be constructed with a bracket that has a fan bracing portion and a connecting blade. The fan bracing portion has an upside down U-shape and is formed to fit and contact the outer edge of the ventilating fan to allow the fan to be clamped in place. The chassis of the computer has a bottom plate with a positioning groove and a boss located nearby that receives the bottom side of the fan and the connecting blade of the bracket, respectively. The ventilating fan is secured to the bottom plate when the connecting blade of the bracket is fixed to the boss by a fastener.

Preferably, the fan bracing portion has two downwardly facing panels along opposing edges of its center segment that form a pair of compression flanges. The connecting blade of the bracket meets one end the fan bracing portion at close to a right angle. Furthermore, the fan bracing portion has two pairs of flanges extending inwardly from opposing segments of the fan bracing portion. Each flange in the two pairs of flanges has a depression on a free end. The two pairs of flanges compress the periphery of the fan housing and the depressions in ends of the two pairs of flanges can be fitted into the upper mounting holes of the fan to provide a secure engagement for the fan.

The fan mounting device constructed according to the principles of the present invention the space occupied by a fan to be minimized. By minimizing the area needed by the fan it is possible to secure the fan in even smaller housings. Additionally, the number of screws needed is greatly reduced because the fan mounting device needs only one fastener to secure the connecting blade to a housing or circuit board By needing only one screw to secure the fan, the speed of assembly increases resulting in a corresponding increase in manufacturing efficiency. By using a boss to secure the bracket and fan to the computer, compensations can be made if a fan is too large in one dimension by merely including a spacer or washer between the boss and the connecting blade.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE DRAWINGS

Figure 1:
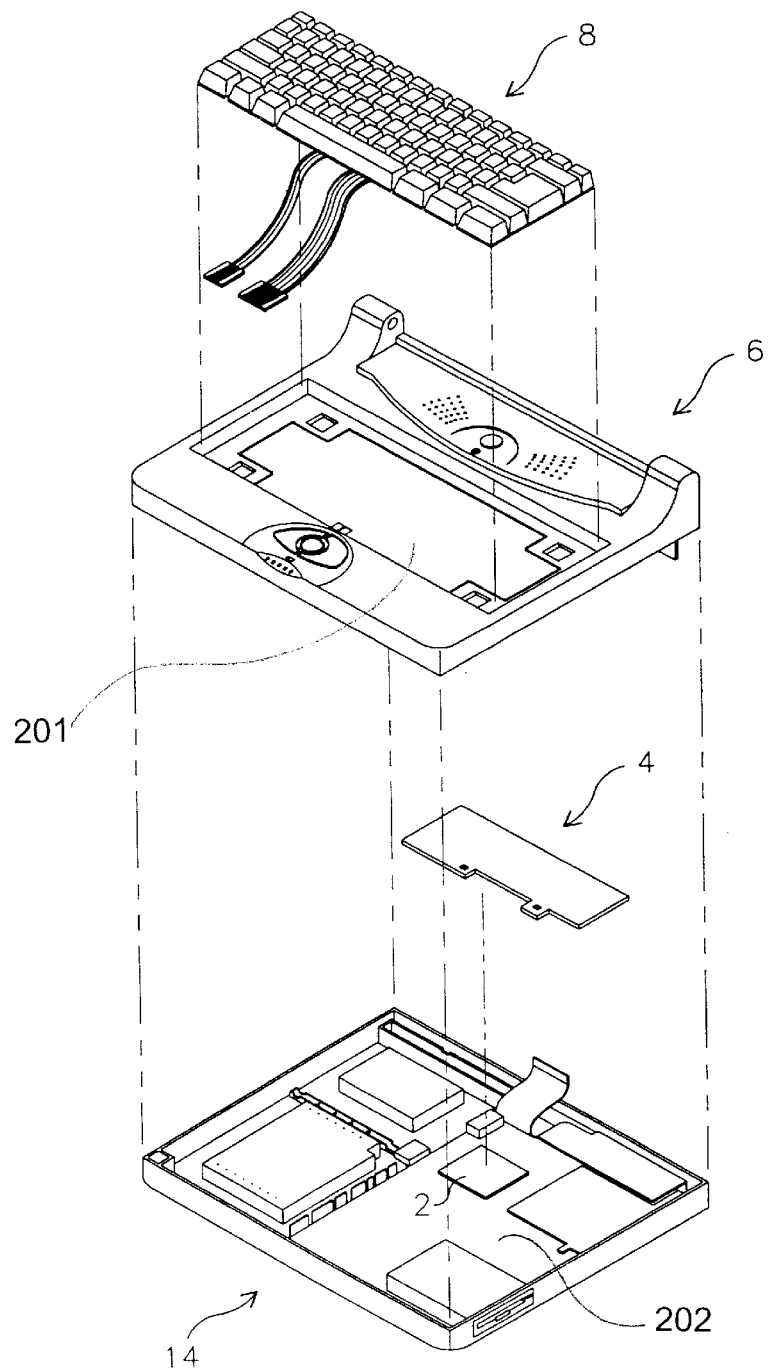
FIG. 1 is an exploded view of a portable computer showing a heat sink associated with the central processing unit that is mounted within the portable computer housing.

Turning now to the drawings, FIG. 1 illustrates a portable computer that is constructed with top housing 6 and bottom housing 14 that combine to form the main body of the computer. Keyboard 8 is installed in opening 201 of top housing 6. Bottom housing 14 has main board 202 with central processing unit 2. To compensate for the heat generated by central processing unit 2, heat sing 4 is attached to the central processing unit to increase the heat-dissipating surface area of central processing unit 2. Heat sink 4 has a flat panel shape that it can be readily accommodated within the main body of the portable computer.

Figure 2:
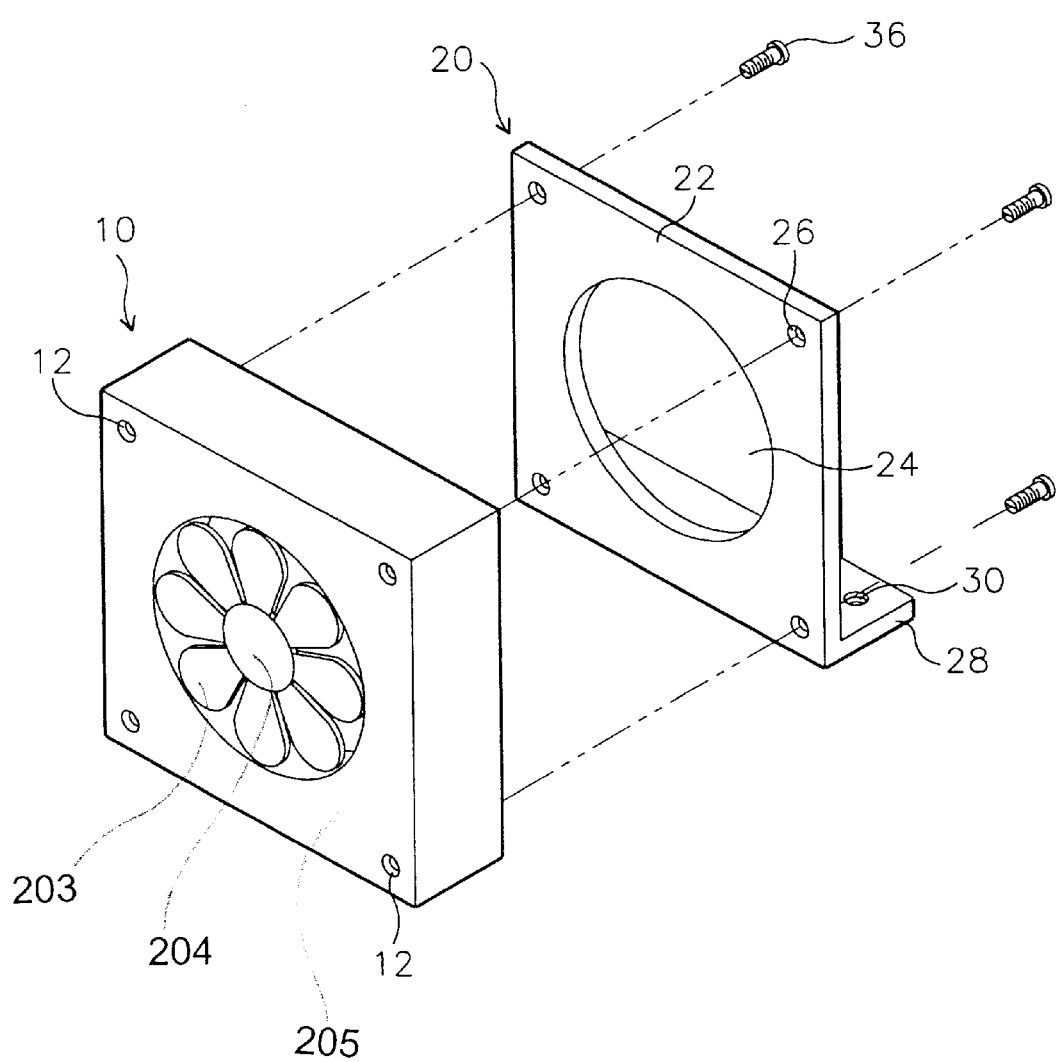
FIG. 2 is an exploded view of a ventilating fan assembly that uses a bracket to mount the fan inside a computer.
Figure 3:
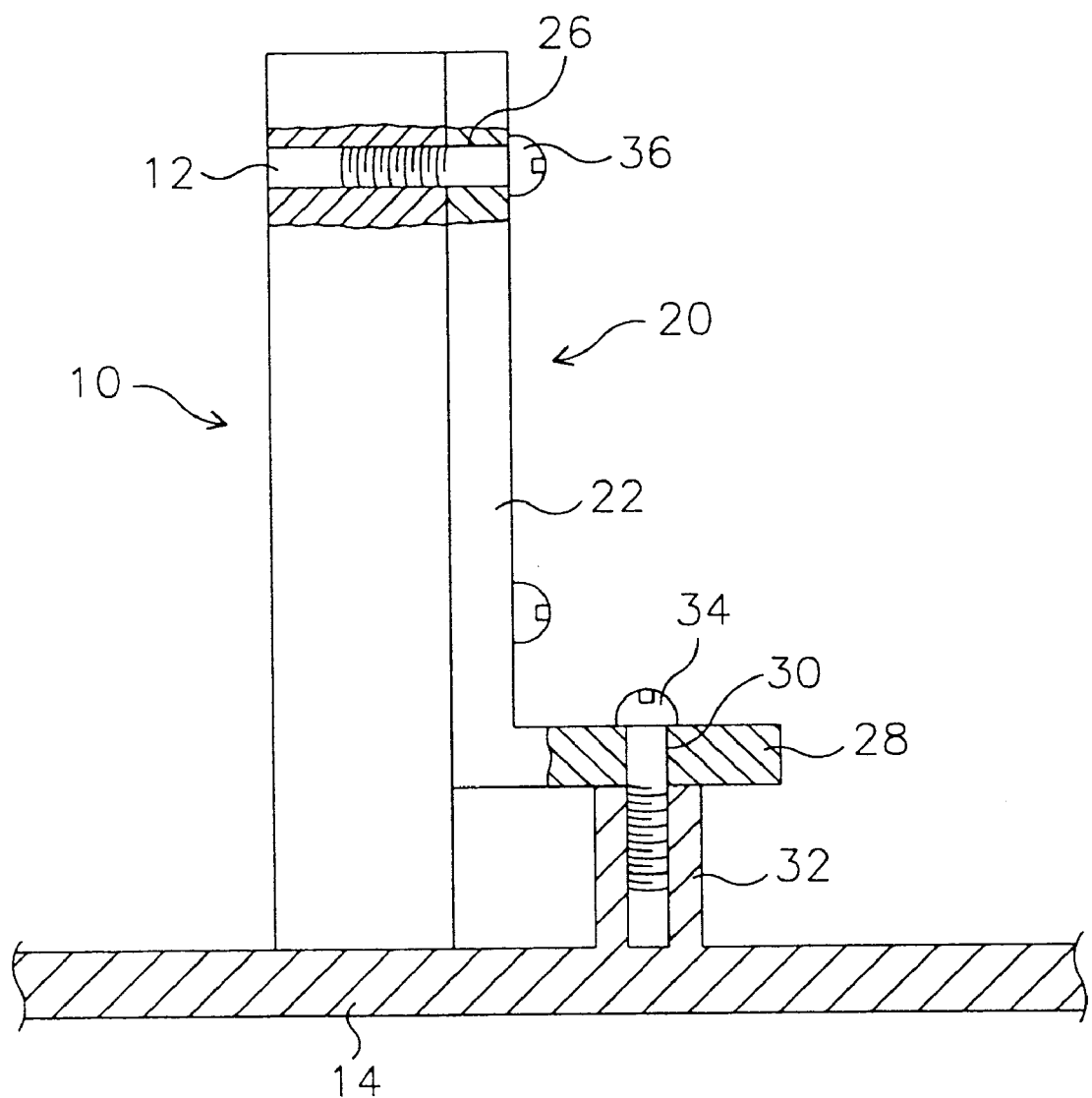
FIG. 3 is a side elevation partly cross-sectional view of the fan assembly of FIG. 2 mounted on the bottom side of the housing in a portable computer.

In addition to heat sink 4, a ventilating fan can be installed within the portable computer to provide an efficient means to dissipate the heat generated by central processing unit 2. FIG. 2 shows an example of ventilating fan 10 mounted on bracket 20. Fan 10 is commonly referred to as a biscuit-type fan, because the entire fan system is encased within a single housing and it is about the size of a biscuit. The fan is constructed with hub 203 and a plurality of vanes or blades 204 encased in shroud 205. The vanes of the fan are driven by a motor enclosed within the hub. FIG. 3 shows the fan attached to bracket 20 and then mounted onto bottom housing 14. Bracket 20 has opening 24 formed in the center portion of the bracket along with holes 26 positioned near the corners of bracket 20. Bracket 20 is coupled to fan 10 by a plurality of screws 36 that penetrate through holes 26. Additionally, bracket 20 has flange 28 that has screw holes 30 located near the corners of the flange. Before fan 10 is mounted inside the portable computer, bracket 20 is attached to fan 10. Then, to attach the combination to the computer, flange 28 of bracket 20 is placed on boss 32 that is located in bottom housing 14. Boss 32 is formed with a threaded hole that fastenably receives screw 34. Thus, mounting fan 10 in the portable computer necessitates using many screws 34, 36 on bracket 20. This inevitably prolongs the time for assembly and causes inconvenience to users during the maintenance or the replacement of the fan.

Figure 4:
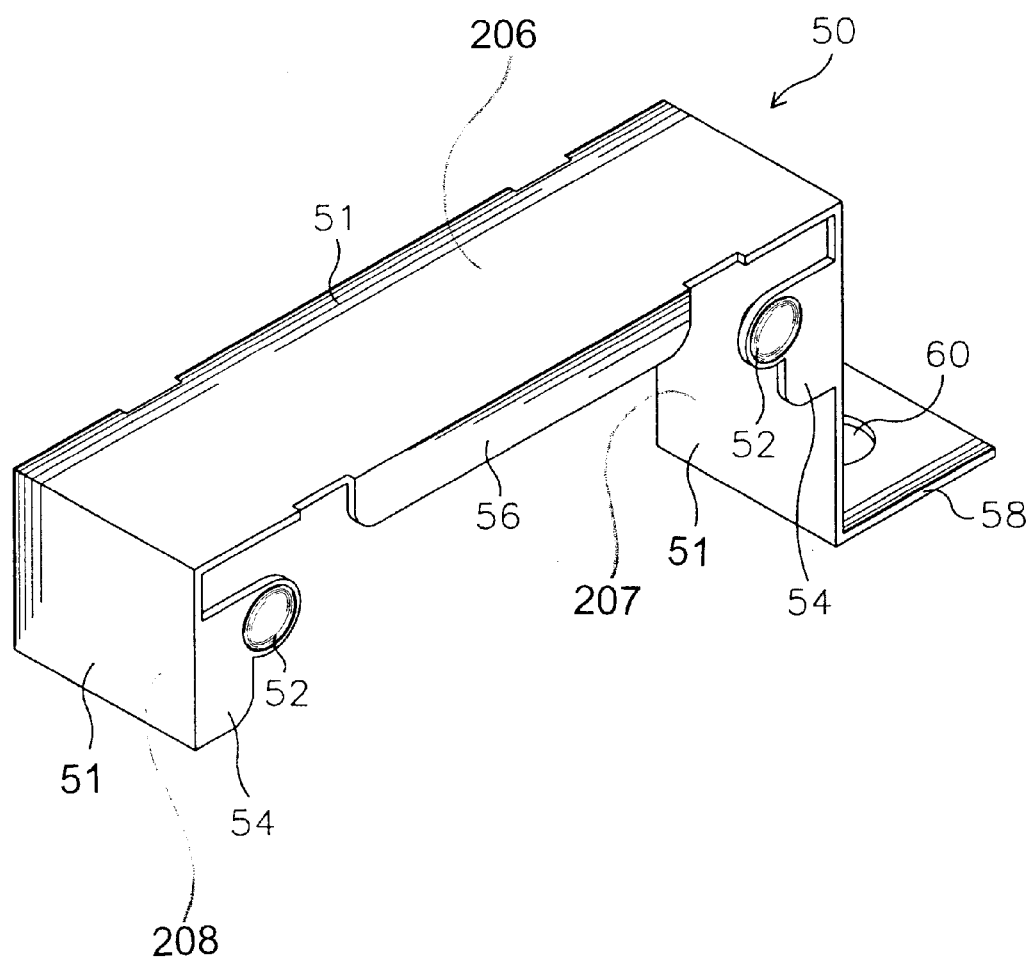
FIG. 4 is an isometric view of a bracket constructed according to the principles of the present invention for use with a rectangle type fan that is mounted into a computer.

The mounting device constructed according to the principles of the present invention provides an efficient means for mounting a fan in the portable computer. Additionally, the area occupied by the fan inside the computer is minimized. The number of parts necessary for mounting the fan are also reduced. The mounting device of the present invention uses a bracket that has a simplified structure and is easy to mount, along with the fan, inside a portable computer, as shown in FIG. 4. Bracket 50 is constructed using fan bracing portion 51 and connecting blade 58. The fan bracing portion 51 has an upside down U-shape. Central segment 206 of fan bracing portion 51 has a pair of downwardly protruding panels attached along its edges that effectively form pair of compression flanges 56. Connecting blade 58 is attached to side segment 207 of fan bracing portion 51 at close to a right angle. On both ends of central segment 206 are side segments 207 and 208 that together with central segment 206 form the upside down U-shape of the fan bracing portion. Opposing side segments 207 and 208 each have pair of inwardly protruding flanges 54 that attach to fan 10. Each flange in either pair of protruding flanges 54 has a depression or dimple 52 on their free end. Dimples 52 on flanges located on the same segment of the fan bracing portion face each other. Bracket 50 may be made of plastic material, composite material, or any light metal that has the desired resilient characteristics.

Figure 5:
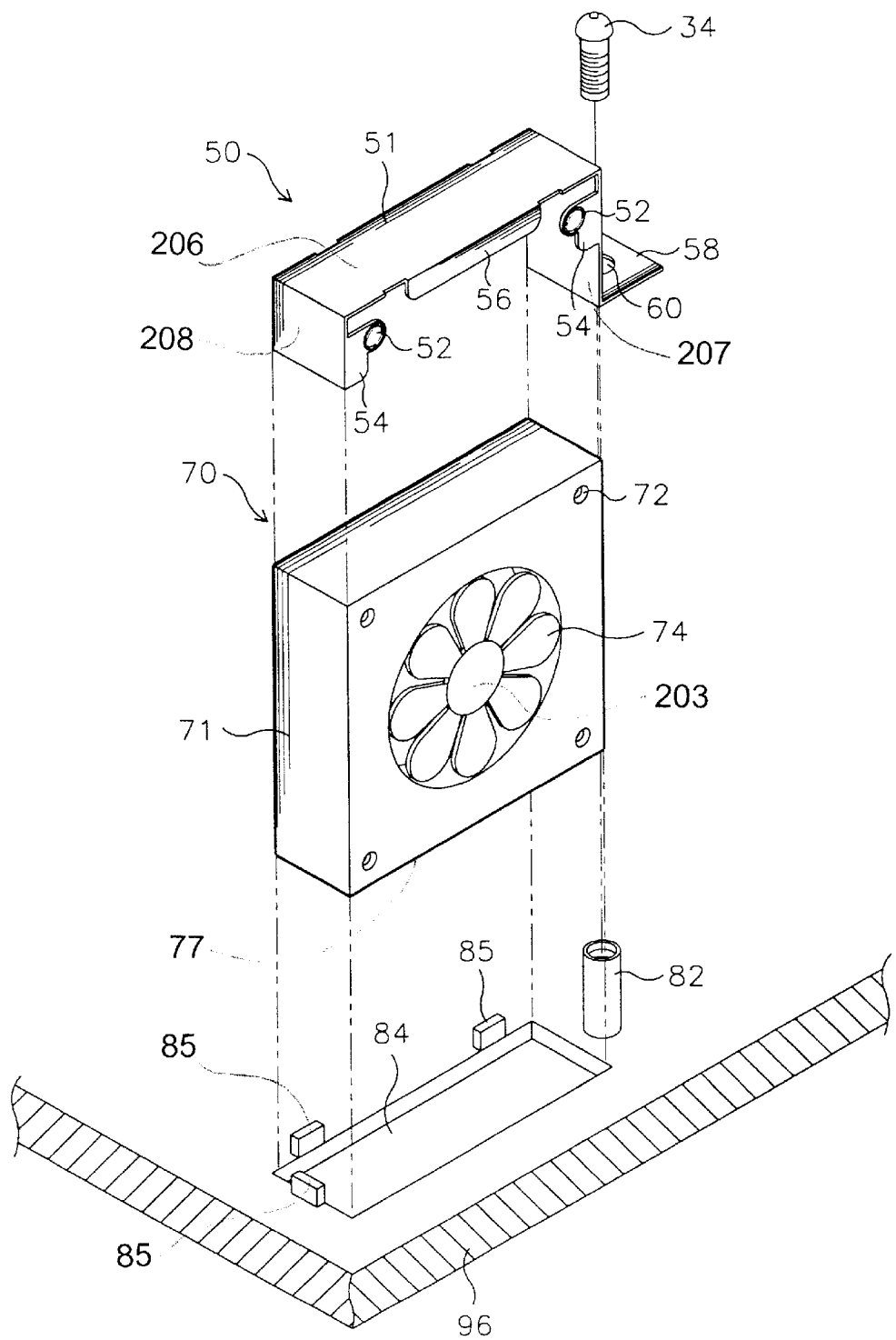
FIG. 5 is an exploded view of the bracket of FIG. 4 along with a fan and the bottom plate of a computer.
Figure 8:
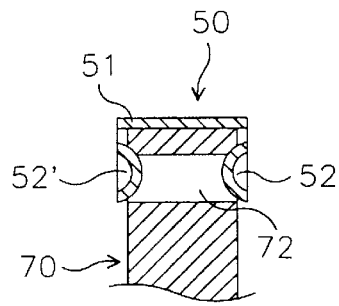
FIG. 8 is a partial cross-sectional view showing the fan and the bracket in an assembled state.

As shown in FIG. 5, the ventilating fan used in this invention is a biscuit-type fan that has hub 203 and vanes 74 encased within shroud 71. Vanes 74 of the fan are driven by a micro-motor enclosed within hub 203. Fan 70 is positioned between side segments 207 and 208 of fan bracing portion 51. The distance between the side segments 207 and 208 and compression flanges 56 are sized appropriately to snugly fit onto the outer edges of ventilating fan 70. Once the fan is inserted into bracket 50, it is clamped in place. The pair of flanges 54 on side segments 207 and 208 clamp onto the outer edges of shroud 71 to prevent fan 70 swaying around compression flanges 56. Furthermore, dimples 52 on the two pairs of flanges 54 fit into upper side holes 72 of fan 70 to securely engage fan 70 without using screws, as also shown in FIG. 8.

Figure 9:
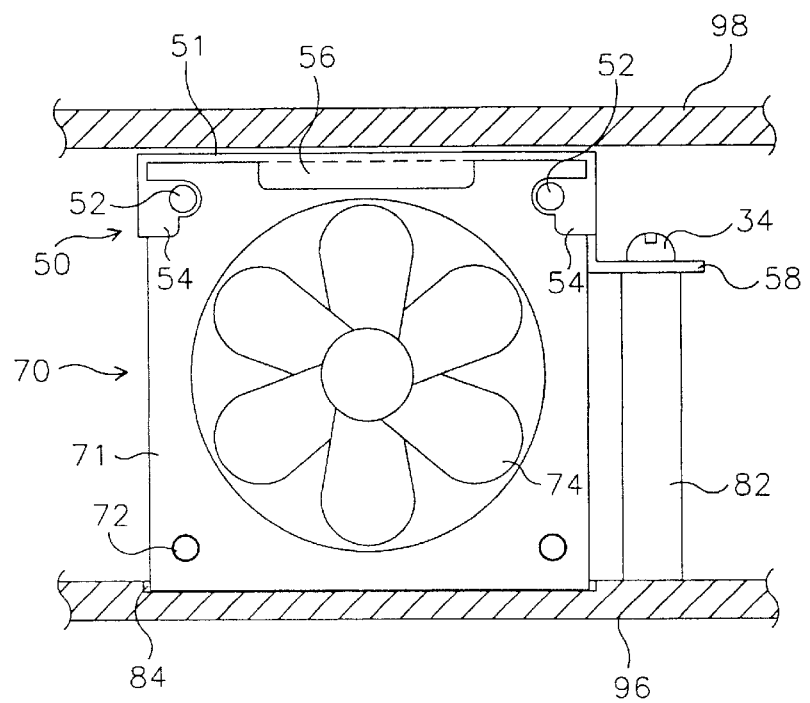
FIG. 9 is a front view of a ventilating fan mounted in a portable computer using the bracket of FIG. 4.

Positioning groove 84 is located under fan 70 and receives bottom surface 77 of the fan. Boss 82 is located nearby for connecting blade 58 to fasten to. Supports 85 are located on bottom housing 96 to help guide ventilating fan 70 into groove 84 while it is installed. Positioning groove 84 is sized to allow it to fit and contact bottom edge 77 of ventilating fan 70. The height of boss 82 is also constructed to receive connecting blade 58 of bracket 50. Thus, when fan 70 engages bracket 50 and is mounted on bottom housing 96, the bottom portion 77 of fan 70 is inserted inside groove 84. Then, fan 70 is secured by using a single fastener 34 that is inserted through hole 60 in connecting blade 58 and inserted into boss 82. The fastener can be any of a screw, bolt, rivet, or solder. A fully mounted fan is shown in FIG. 9.

Figure 6:
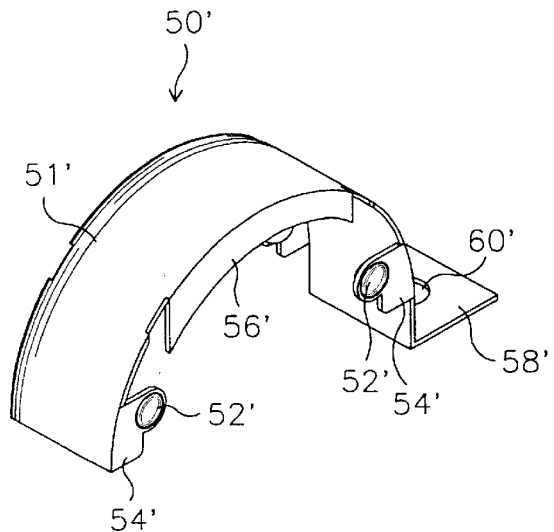
FIG. 6 is an isometric view of a second embodiment of a bracket built according to the principles of the present invention for use with a circular type of fan that is mounted inside a computer housing.
Figure 7:
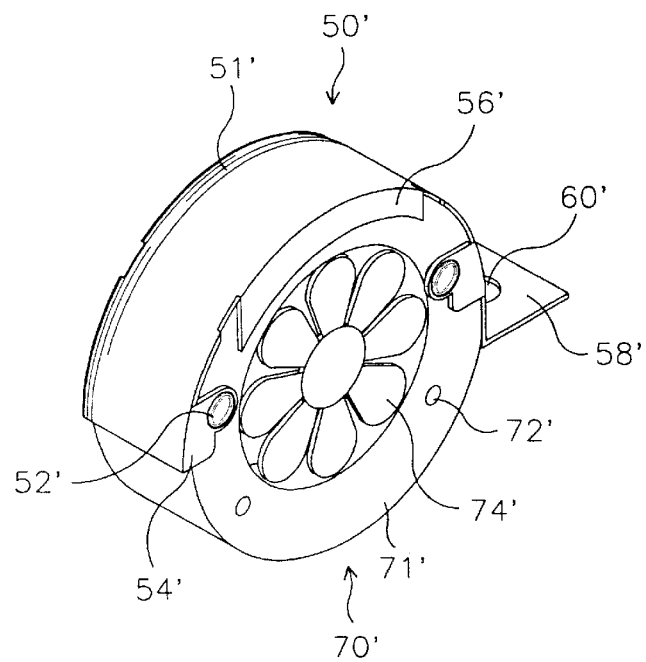
FIG. 7 is a perspective view of the bracket of FIG. 6 attached to a circular fan.

A second embodiment of bracket 50 as constructed according to the principles of the present invention is configured to have arc shape that is compatible with a circular type fan. As shown in FIG. 6, arc shape bracket 50' is constructed with fan bracing portion 51' and connecting blade 58'. Fan bracing portion 51' is rounded to create an arc shape that is otherwise similar to the first embodiment. The arc shaped fan bracing portion also has pair of compression flanges 56' and two pairs of flanges 54' opposingly located on both ends of fan bracing portion 51'. The free ends of pairs of flanges 54' each have a depression or dimple 52'. Connecting blade 58' extends from one end of fan bracing portion 51'. Bracket 50' may be made of plastic material, composite material, or any light metal that has the desired resilient characteristics. The only significant structural difference between rectangle bracket 50 and arc shape bracket 50' is shape of the fan bracing portion. The function of arc shaped bracket 50' is the same as that of the rectangle bracket 50. Arc shape bracket 50' is snaps into engagement with circular type fan 70', as shown in FIG. 7.

Figure 10:
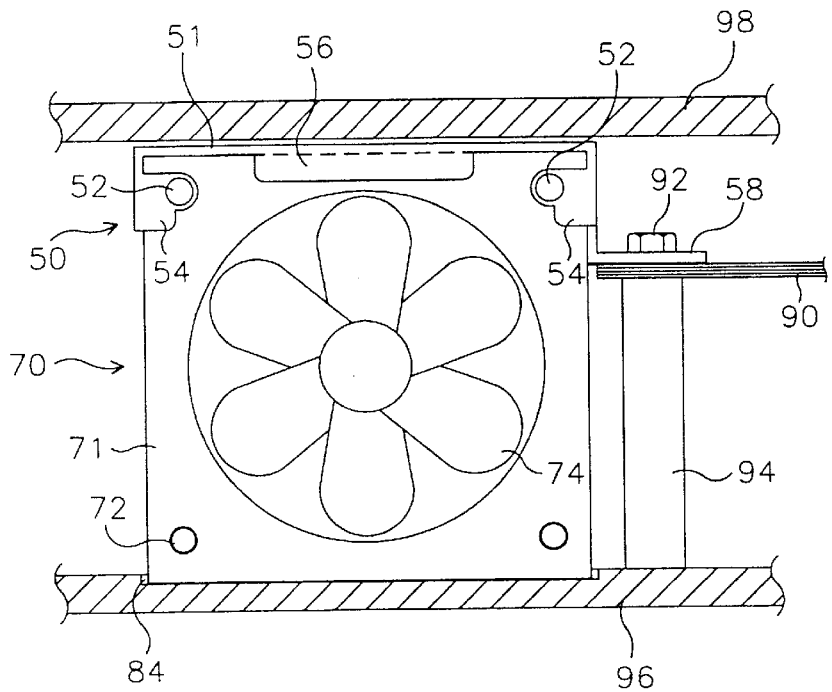
FIG. 10 is a similar view to that of FIG. 9 that shows the fan mounted onto a circuit board using the bracket of FIG. 6.

Ventilating fan 70 may be mounted in the portable computer together with circuit board 90 using bracket 50. As shown in FIG. 10, the corner of circuit board 90 is preferably placed upon boss 94 when fan 70 is engaged with bracket 50 and then installed inside the portable computer. Connecting blade 58 of bracket 50 is also placed upon the corner of circuit board 90. This allows bracket 50 and circuit board 90 to be secured at the same time by using fastener 92.

Figure 11:
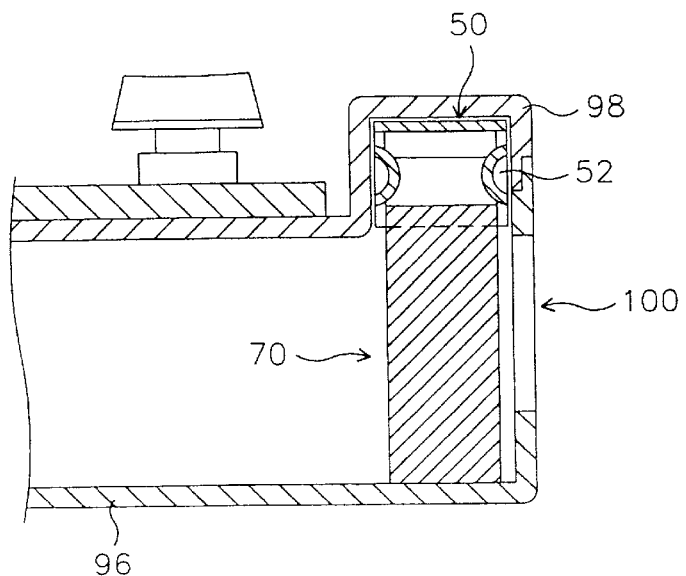
FIG. 11 is a partial cross-sectional view of the invention showing a slim type of portable computer that has a fan mounted in a sidewall area of the computer by using the bracket of FIG. 4.
Figure 13:
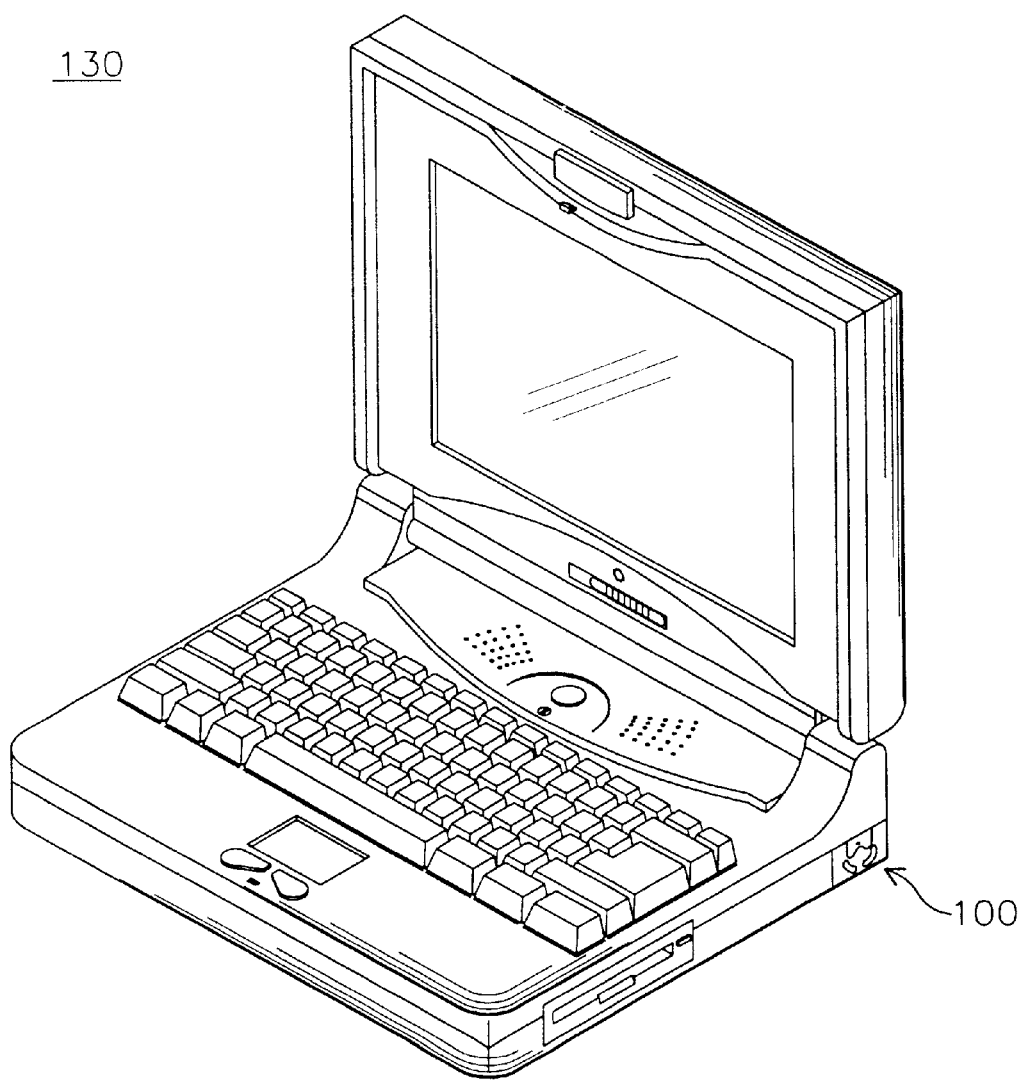
FIG. 13 is a perspective view of the portable computer showing a ventilation hole positioned in a sidewall.

FIG. 11 shows a cross-sectional view of a slim type of portable computer that has ventilating fan 70 installed into a sidewall area of the computer housing using bracket 50. The height of fan 70 and bracket 50 assembly is almost same as the inner height of the housing of the portable computer. Preferably, vent hole 100 is formed in a sidewall area of bottom housing 96. The location of vent hole 100 is clearly seen in FIG. 13.

Figure 12:
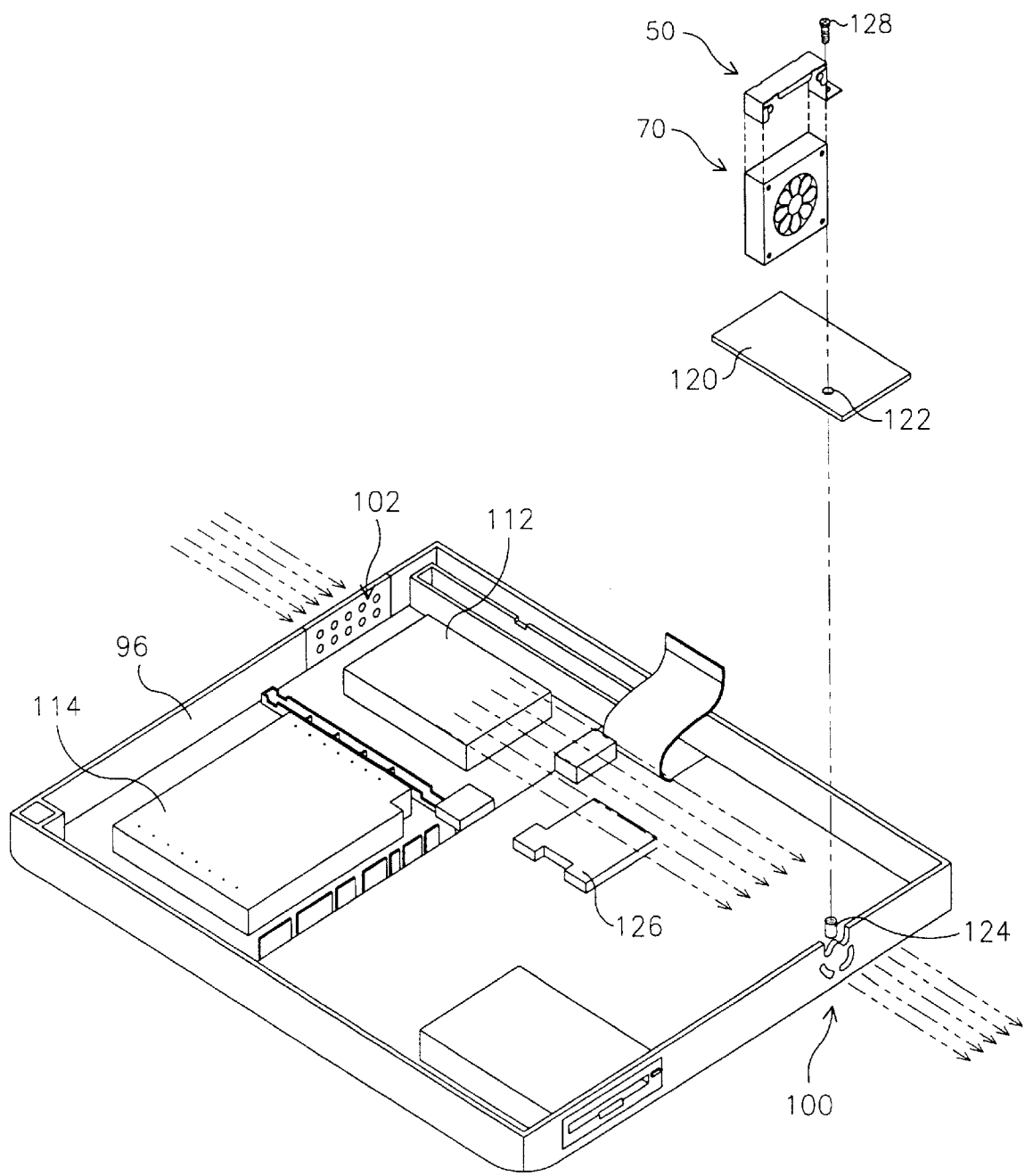
FIG. 12 is an exploded view of the bracket of FIG. 4 being attached to the bottom housing of a portable computer that has a heat sink mounted on the central processing unit used together with the fan and bracket assembly.

Furthermore, ventilating fan 70 may be mounted in the portable computer together with a heat sink 120 using bracket 50, as shown in FIG. 12. The corner of heat sink 120 has hole 122 preferably placed upon boss 124 when fan 70 with bracket 50 is installed in the portable computer. The connecting blade of the bracket 50 is then placed upon the corner of heat sink 120 and the securing of bracket 50 and heat sink 120 can be performed at the same time by using one fastener 128.

The fan mounting device of the present invention allows the space occupied by the fan within a portable computer to be minimized and the number of parts necessary for mounting the fan to be reduced. This results a timesavings during the fan assembly process and improves the total efficiency of the computer assembly process. Although two preferred embodiments of the present invention have been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A device for mounting a fan in a computer, comprising:
a bracket having a fan bracing portion and a connecting blade, said fan bracing portion having a C-shape and clampably engaging an outer surface of a housing of said fan, said fan being a biscuit type fan and said fan housing being any one of either a circular shaped housing, a square shaped housing, and a rectangular shaped housing;
an inner surface of a chassis of said computer having an indentation for receivably engaging said housing of said fan;
a boss mounted on said inner surface of said chassis of said computer, having a threaded recess in a distal end alignable with a bore in said connecting blade of said bracket, and having a predetermined height to fastenably engage said connecting blade of said bracket; and
said fan being engaged by said fan bracing portion of said bracket, being inserted into said indentation in said inner surface of said chassis, and being secured in position by fastening said connecting blade of said bracket to said boss.

2. The device of claim 1, further comprised of said fan bracing portion comprising a central segment and two opposing side segments, said central segment of said fan bracing portion having two inwardly protruding flanges forming a pair of compression flanges.

3. The device of claim 2, further comprised of said connecting blade connected to a distal end of one of said two opposing side segments of said fan bracing portion of said bracket.

4. The device of claim 2, further comprising said two opposing side segments of said bracket each having a pair of flanges extending inwardly to further secure said fan in said bracket.

5. The device of claim 4, further comprised of said pair of flanges on each of said two opposing side segments of said bracket compressably engaging said housing of said fan and having depressions on a distal end that insertably engage with a plurality of upper mounting holes in said fan.

6. The device of claim 1, further comprised of said fan being mounted with a circuit board, said circuit board having a hollow near an edge to allow said board to be fastenably secured to both said connecting blade and said boss when said fan is installed in said computer.

7. The device of claim 1, further comprising said chassis of said computer having a vent hole formed in a sidewall adjacent to the location of said fan.

8. The device of claim 1, further comprising a plurality of plugs positioned peripherally around said indentation to facilitate the insertion of said fan into said indentation.

9. A device for mounting a fan in a computer, comprising:

a bracket having a fan bracing portion and a connecting blade, said fan bracing portion clampably engaging an outer surface of a housing of said fan;

an inner surface of a chassis of said computer having an indentation for receivably engaging said housing of said fan;

a boss mounted on said inner surface of said chassis of said computer and fastenably engagable with said connecting blade of said fan; and said fan being engaged by said fan bracing portion of said bracket, being inserted into said indentation in said inner surface of said chassis, and being secured in position by fastening said connecting blade of said bracket to said boss.

10. The device of claim 9, further comprised of said fan bracing portion having a C-shape comprising a central segment and two opposing side segments, said central segment of said fan bracing portion having two inwardly protruding flanges forming a pair of compression flanges.

11. The device of claim 10, further comprised of said connecting blade connected to a distal end of one of said two opposing side segments of said fan bracing portion of said bracket.

12. The device of claim 10, further comprising said two opposing side segments of said bracket each having a pair of flanges extending inwardly to further secure said fan in said bracket.

13. The device of claim 12, further comprised of said pair of flanges on each of said two opposing side segments of said bracket compressably engaging said housing of said fan and having depressions on a distal end that insertably engage with a plurality of upper mounting holes in said fan.

14. The device of claim 9, further comprised of said boss having a predetermined height to fastenably engage said connecting blade of said bracket to secure said fan to said computer.

15. The device of claim 9, further comprised of said connecting blade of said bracket having a bore that aligns with a threaded recess in a distal end of said boss.

16. The device of claim 9, further comprised of said fan being mounted with a circuit board, said circuit board having a hollow near an edge to allow said board to be fastenably secured to both said connecting blade and said boss when said fan is installed in said computer.

17. The device of claim 9, further comprising said chassis of said computer having a vent hole formed in a sidewall adjacent to said fan.

18. The device of claim 9, further comprising a plurality of plugs positioned peripherally around said indentation to facilitate the insertion of said fan into said indentation.

19. The device of claim 9, further comprised of said fan being a biscuit type fan and said fan housing being any one of either a circular shaped housing and a rectangular shaped housing.

20. A device for mounting a fan in a computer, comprising:

a bracket having a fan bracing portion and a connecting blade, said fan bracing portion said fan bracing portion having a C-shape comprising a central segment and two opposing side segments, said central segment of said fan bracing portion having two inwardly protruding flanges forming a pair of compression flanges, said fan clampably engaging an outer surface of a housing of said fan and being a biscuit type fan, said housing of said fan being any one of either a circular shaped housing, a square shaped housing, and a rectangular shaped housing;

a pair of flanges inwardly extending from each of said two opposing side segments of said bracket to engage said housing of said fan and having depressions on a distal end that insertably engage with a plurality of dimples in said housing of said fan;

an inner surface of a chassis of said computer having an indentation for receivably engaging said housing of said fan;

a boss mounted on said inner surface of said chassis of said computer, having a threaded recess in a distal end alignable with a bore in said connecting blade of said bracket, and having a predetermined height to fastenably engage said connecting blade of said bracket; and said fan being engaged by said fan bracing portion of said bracket, being inserted into said indentation in said inner surface of said chassis, and being secured in position by fastening said connecting blade of said bracket to said boss.

21. The device of claim 2, further comprised of said connecting blade connected to a distal end of one of said two opposing side segments of said fan bracing portion of said bracket.

22. The device of claim 1, further comprised of said fan being mounted with a circuit board, said circuit board having a hollow near an edge to allow said board to be fastenably secured to both said connecting blade and said boss when said fan is installed in said computer.

* * * * *